(12) United States Patent
Vicente et al.

(10) Patent No.: US 6,249,435 B1
(45) Date of Patent: Jun. 19, 2001

(54) THERMALLY EFFICIENT MOTOR CONTROLLER ASSEMBLY

(75) Inventors: Nathaniel B. Vicente, Bridgeport; Javier I. Larranaga, Bristol; Edward E. Kim, Burlington; Joseph Criniti, New Britain; Charles Pitzen; Esteban Santos, both of Farmington, all of CT (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/374,786

(22) Filed: Aug. 16, 1999

(51) Int. Cl.[7] .................................................. H05K 7/20
(52) U.S. Cl. ......................... 361/717; 361/695; 361/704; 361/707; 174/16.1; 174/16.3; 174/52.1; 165/80.2; 165/185; 363/141
(58) Field of Search .................................... 361/704, 707, 361/712, 717, 718, 719–721, 631; 174/16.1, 16.3, 52.1; 165/80.2, 80.3, 185; 363/141

(56) References Cited

U.S. PATENT DOCUMENTS

| | | |
|---|---|---|
| 3,693,047 | 9/1972 | Hamstra . |
| 4,336,568 * | 6/1982 | Mitchell ................................ 361/717 |
| 5,341,080 | 8/1994 | Agut Sanz . |
| 5,657,193 | 8/1997 | Purkayastha . |
| 5,690,468 | 11/1997 | Hong . |
| 5,742,478 * | 4/1998 | Wu ........................................ 361/704 |
| 5,760,556 | 6/1998 | Hamilton, Jr. et al. . |
| 5,774,353 * | 6/1998 | Wieloch ................................ 363/146 |
| 5,946,192 * | 8/1999 | Ishigami et al. ...................... 361/704 |
| 6,087,800 * | 7/2000 | Becker et al. ........................ 318/778 |
| 6,091,604 * | 7/2000 | Plougsgaard et al. ............... 361/707 |
| 6,104,602 * | 8/2000 | Morris et al. ........................ 361/678 |

* cited by examiner

Primary Examiner—Leo P. Picard
Assistant Examiner—Boris L. Chervinsky
(74) Attorney, Agent, or Firm—Cantor Colburn LLP; Carl B. Horton

(57) ABSTRACT

An arrangement for connection between motor controller electronic components and silicon controlled rectifiers (SCR) contained within the controller circuit is presented with line and load straps being arranged on the bottom surface of the motor controller compartment at opposite ends thereof. The SCR's are positioned under the compartment on an elongated heat-sink support plate. Intermediate block connectors interconnect the SCR's with the controller line and load straps.

20 Claims, 3 Drawing Sheets

THERMALLY EFFICIENT MOTOR CONTROLLER ASSEMBLY

BACKGROUND OF THE INVENTION

This invention relates to motor controllers, and, more particularly, to thermally efficient motor controller assemblies.

U.S. Pat. No. 5,341,080 entitled Apparatus and Three Phase Induction Motor Starting and Stopping Control Method, describes starters and contactors used to efficiently start and stop industrial rated electric motors. A more recent example of a motor controller unit is found in U.S. Pat. No. 5,760,556 entitled Motor Controller and Protector Unit. In such motor controllers and electrical contractors, solid state switches, such as silicon controlled rectifiers (SCR), for example, are often employed to controllably switch the motor current to provide smooth motor starting and stopping function. Since the SCR's become heated upon current transfer therethrough, heat sinks in the form of large metal blocks of copper, aluminum and their alloys are required to protect the SCR's from overheating. The SCR's are usually spaced apart from the other motor controller components to facilitate cooling. Electrical connection between the SCR's and the other motor controller components is made by means of electrically-insulated thick metal cables, one for each phase of the associated electrical distribution system.

U.S. patent application Ser. No. 08/904,293 entitled Compact Electrical Equipment Enclosure, describes an equipment enclosure that is open at the rear thereof to provide an air flow, so called "chimney effect." The SCR's connecting with the motor controller are arranged apart from the other motor controller electric components within the air flow path to promote thermal cooling effects. The placement of the SCR's apart from the other electrical components increases the size of the equipment enclosure to some extent. This size limitation is critical when other devices such as circuit breakers and contactors are interconnected as described in U.S. Pat. No. 5,657,193 entitled Electronic Control Module for Motor Controller Units.

BRIEF SUMMARY OF THE INVENTION

In an exemplary embodiment of the invention, an arrangement for connection between motor controller electronic components and SCR's contained within the controller circuit is presented with the line and load straps being arranged on the bottom surface of the motor controller compartment at opposite ends thereof. The SCR's are positioned under the compartment on an elongated heat-sink support plate. Intermediate block connectors interconnect SCR's with the controller line and load straps. A highly-efficient cooling fan is arranged on the elongated heat-sink support plate to rapidly control the temperature of the SCR's during motor start and stop function. A thermistor control switch can be employed for turning the switching the cooling fan in accordance with the SCR cooling requirements. In this exemplary embodiment, the SCR's do not have to be separate from the other components or employ special motor controller equipment enclosure designs, as in the prior art. This arrangement provides efficient means for cooling the SCR's with a minimum space and cost requirement while facilitating electrical connection between the motor controller components and the SCR's as well as between the SCR's and the electrical distribution system connectors.

DESCRIPTION OF THE PREFERRED EMBODIMENT

Figure 1:
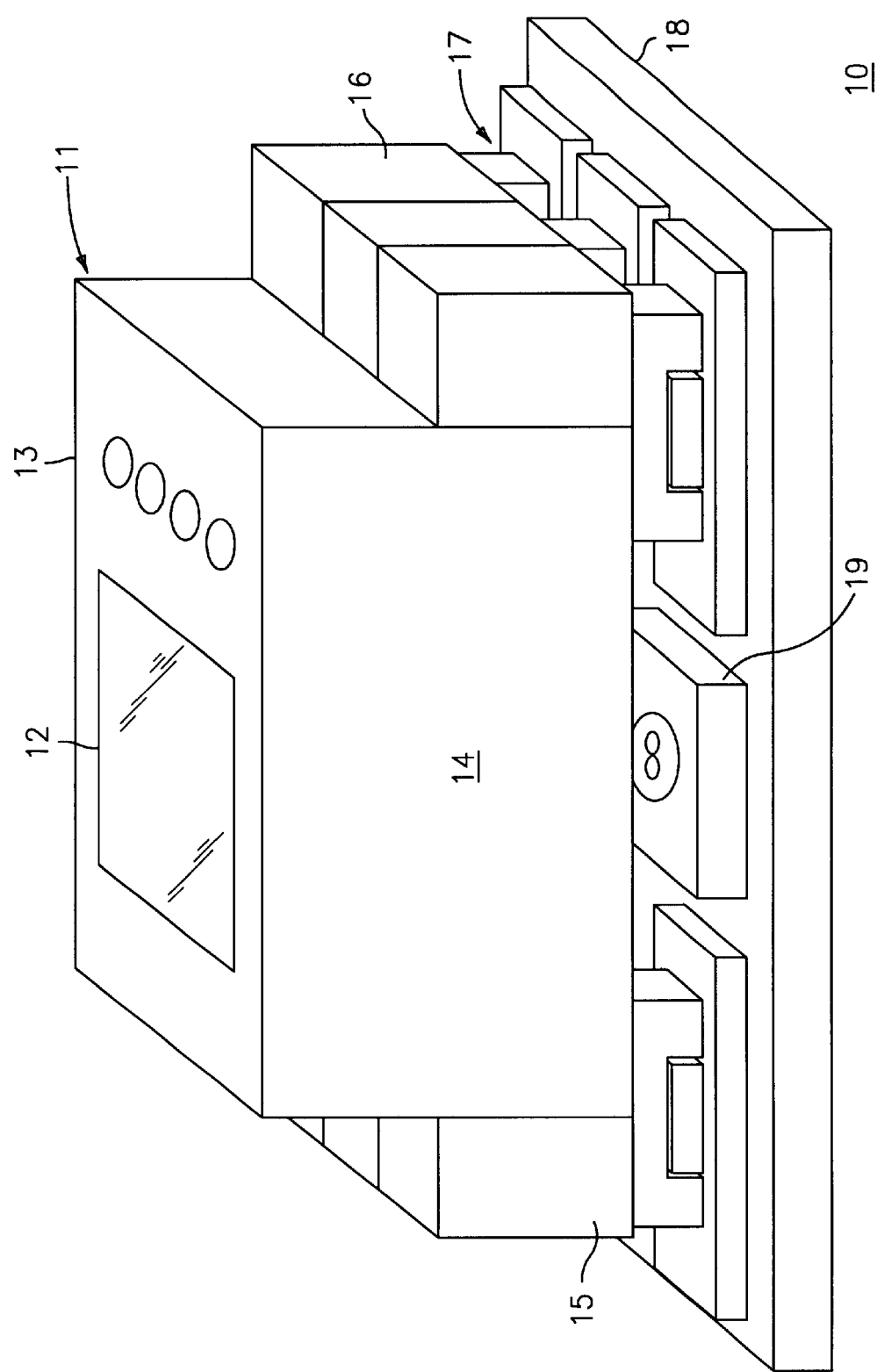
FIG. 1 is a top perspective view of a motor controller unit attached to the SCR cooling assembly in accordance with the invention.

Referring to FIG. 1, a motor controller assembly is generally shown at 10 such as described in the aforementioned U.S. Pat. No. 5,341,080, which is incorporated by reference. Motor controller assembly 10 includes a motor controller unit 14, a motor starter 11, a display 12 and control buttons 13 positioned on a heat sink plate 18. Line straps 15 and load straps 16 are arranged outboard the unit on the opposite ends of the heat sink plate. Heat sink plate 18 is fabricated from, e.g., an aluminum alloy for good thermal transport, or other suitable material. An SCR assembly 17 is arranged under the line and load straps in the manner to be described below and a cooling fan 19 assembly, similar to that described within U.S. Pat. No. 5,690,468 entitled Fan Assembly for An Integrated Circuit, which is incorporated by reference, is attached to the heat sink plate to promote rapid heat transfer away from the SCR assembly. Although a cooling fan is described herein, other cooling devices can be employed, e.g., a liquid cooled device, an air cooled device. One such cooling device is described in U.S. patent application Ser. No. 09/337,095 entitled Semiconductor Thermal Protection Arrangement, filed Jun. 21, 1999, now U.S. Pat. No. 6,108,206, which is incorporated by reference.

Figure 2:
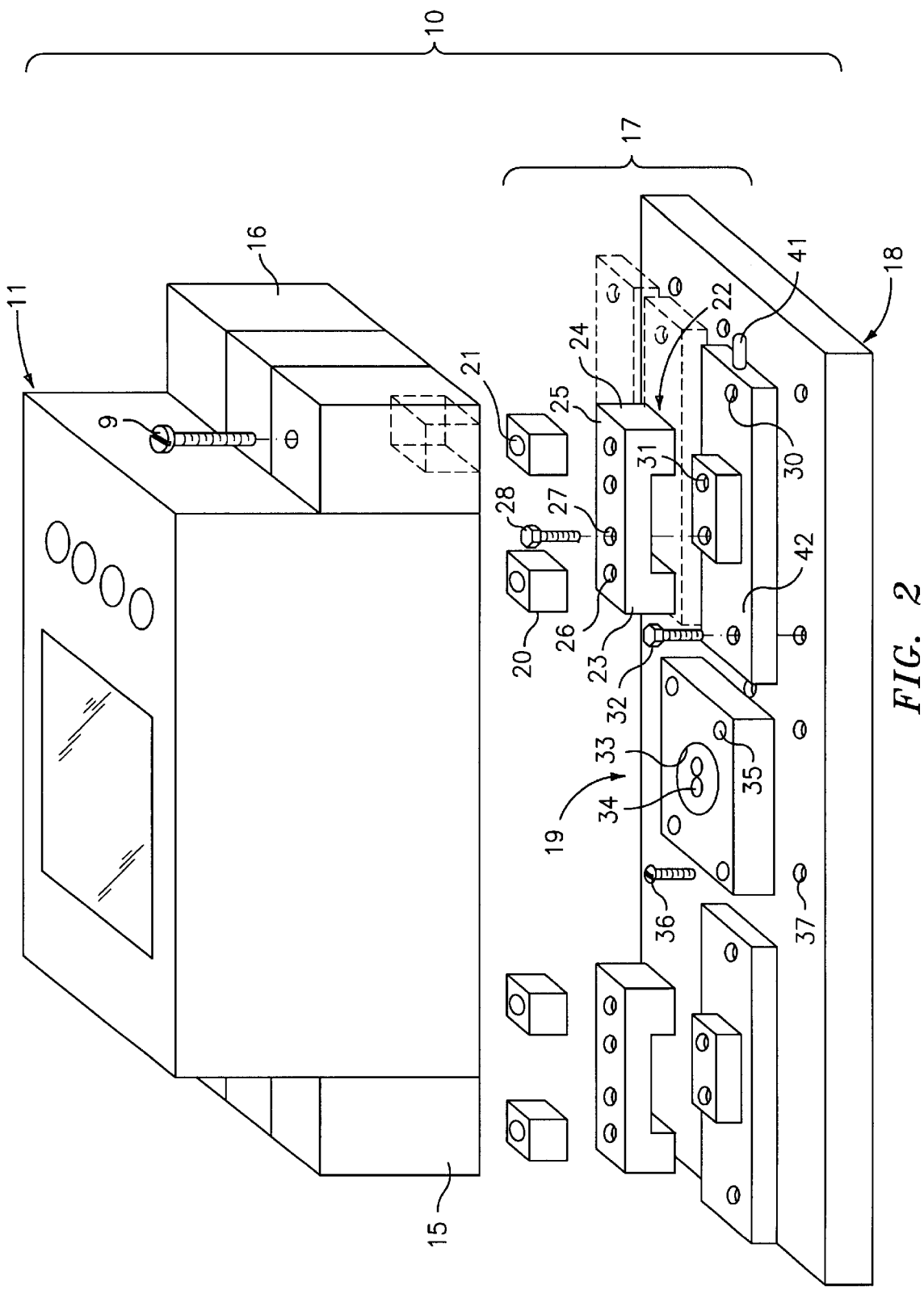
FIG. 2 is a top perspective view of the motor controller unit in isometric projection with the components of the SCR cooling assembly of FIG. 1.

The motor controller assembly 10 is shown in FIG. 2 prior to attaching the motor starter 11 and prior to attaching the SCR assembly 17 to the heat sink plate 18. The heat sink plate 18 with the cooler fan 19 attached thereon, is fastened to the heat sink plate through holes 35, 37 by screws 36 for attaching the SCR assembly prior to attaching the motor controller to the SCR assembly. The cooling fan assembly 19 includes a central aperture 33 for egress of the heated air away from the heat sink plate 18 by a high speed fan 34.

SCR assembly 17 includes heat sink plate thru-holes 30 on opposite ends for attaching the assembly to the heat sink plate 18 by bolts 32. Bridge block thru-holes 31 at the middle thereof provide for attachment of a U-shaped bridge block connector 22 by bolts 28. The U-shaped bridge block 22 defines a pair of opposing sidepieces 23, 24 joined by a top bridge 25 and is also fabricated from, e.g., an aluminum alloy. SCR thru-holes 27 through the center portion of the top bridge 25 receive the bolts 28 before threadingly engaging the bolts 28 within the bridge block thru-holes 31 in the top part of the SCR. Elongated thru-holes 26 extending through the sidepieces 23, 24 are aligned under a pair of stand-off spacers 20, each having an elongated thru-hole 21. The load straps 16 on the load side of the controller 11 and the line straps (not shown) on the line side thereof are attached to the U-shaped bridge block 22 by spacers 20 via spacer thru-holes 21, thru-holes 27 and elongated bolts 9 to complete the assembly 17 via spacer thru-holes 21, thru-holes 27 and elongated bolts 9 to complete the assembly 10. A thermistor 41 can be arranged on the SCR assembly 17 and connected with a control circuit over conductor 42 to turn the cooling fan 34 ON and OFF in accordance with the temperature range programmed within the control circuit in the manner described within U.S. Pat. No. 3,693,047 entitled, Apparatus for Protecting Electrical Devices, which is incorporated by reference.

Figure 3:
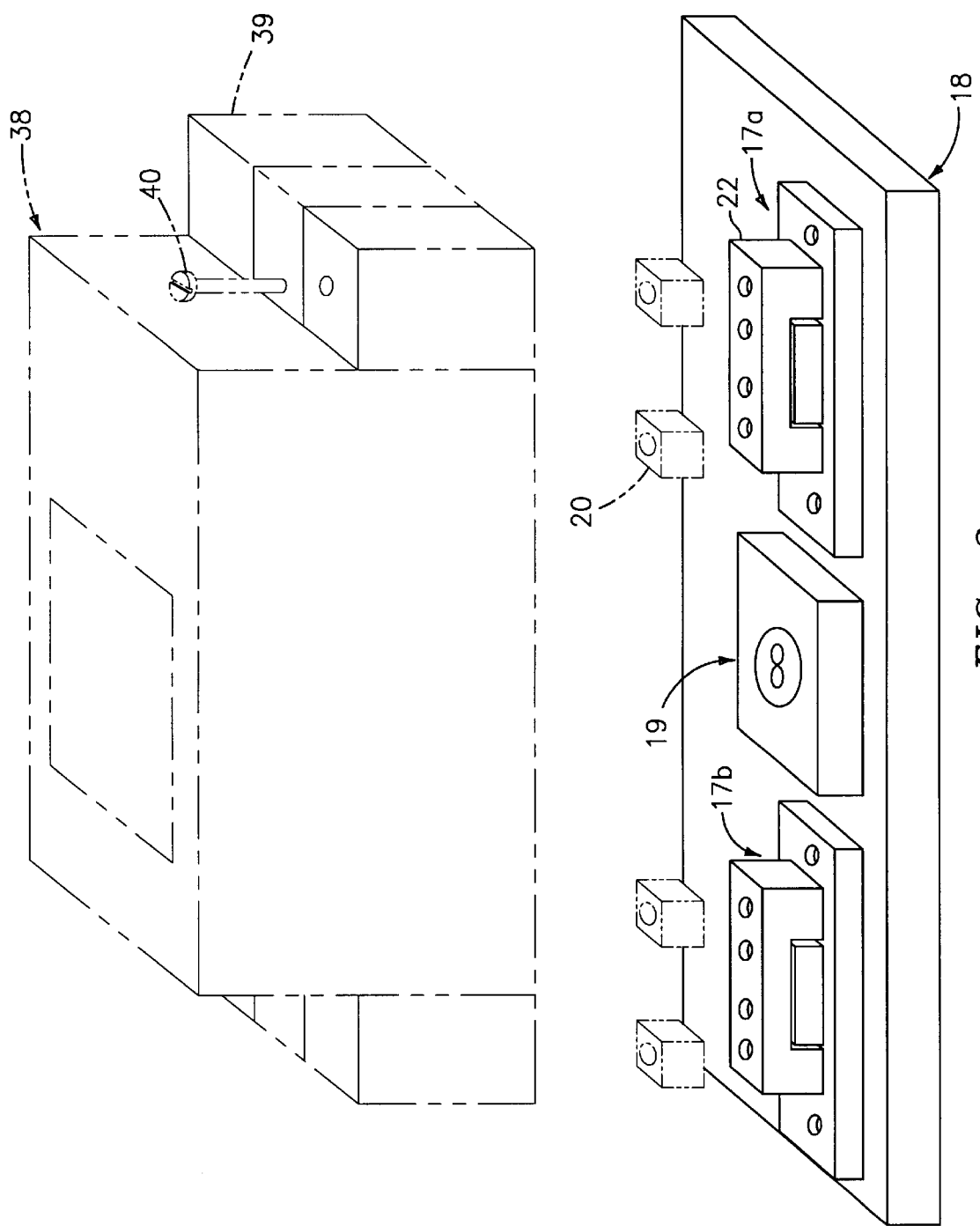
FIG. 3 is a top perspective view of the SCR cooling assembly and heat plate of FIG. 1 with a contactor unit depicted in isometric projection.

The SCR assembly 17 is shown in FIG. 3 prior to attaching an electric contactor 38 shown in phantom. The assembly 17 with the a set of three such line side SCR assemblies 17A, for connecting with each pole on the line end and a set of three such load side SCR assemblies 17B for connecting with each pole on the load end of the contactor 38. Corresponding U-shaped bridge blocks 22 are attached to each of the line and load end SCR assemblies 17A, 17B, as indicated. The spacers 20, shown in phantom, are configured for the spacing requirements between the line straps 39 on the contactor 38 and the line end U-shaped bridge blocks 22 to facilitate connection therewith by bolts 40, shown in phantom. The spacers are also fabricated from, e.g., an aluminum alloy. The line and load end SCR assemblies 1 7A, 1 7B along with the cooling fan assembly 19 on the heat sink plate 18 are shown prior to connection with a contactor 38. This is by way of example only, since it is believed that the SCR assemblies, heat sink plate and cooling motor can be adapted for use with any electrical device employing SCR's within industrial applications, with the spacers 20 and bolts 40 being correspondingly adapted to provide electrical connection with the electrical device and the SCR assemblies.

An SCR assembly has herein been disclosed for use with electrical devices such as motor controllers, contactors and the like for providing optimum cooling to the SCR's both during short term high current operating conditions as well as under long time continuous operation during quiescent current operating conditions.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A cooling assembly for semiconductor switches comprising:
   a heat sink support plate;
   a plurality of semiconductor switch devices mounted on said heat sink support plate;
   a cooling assembly arranged on said heat sink support plate for removing heat away from said heat sink support plate and said semiconductor switch devices; and
   a connector on said semiconductor switch devices for electrically connecting said semiconductor switch devices with an electrical device, said connector including:
      a U-shaped block defining a first sidepiece and an opposing second sidepiece, said first and second sidepieces joined by a bridge, said bridge including a first pair of apertures arranged superjacent a corresponding second pair of apertures within said semiconductor switch devices.

2. The cooling assembly of claim 1 including:
   a third aperture within said first sidepiece and a fourth aperture within said second sidepiece, said third and fourth apertures being arranged subjacent straps connecting with said associated electrical device.

3. The cooling assembly of claim 2 including:
   a pair of apertured spacers arranged between said associated electrical device and said first and second sidepieces for receiving means for connecting said straps with said first and second sidepieces.

4. The cooling assembly of claim 1 wherein said cooling assembly is air cooled or liquid cooled.

5. The cooling assembly of claim 4 wherein said air cooling device comprises a fan.

6. The cooling assembly of claim 1 wherein said semiconductor switch devices comprise silicon controlled rectifiers.

7. The cooling assembly of claim 1 wherein said electrical device comprises a motor controller or a contactor.

8. The cooling assembly of claim 2 wherein, said third and fourth apertures are arranged subjacent straps connecting with said electrical device.

9. The cooling assembly of claim 1 wherein said heat sink support plate comprises an aluminum alloy.

10. The cooling assembly of claim 1 wherein said U-shaped block comprises an aluminum alloy.

11. The cooling assembly of claim 3 wherein said spacers comprise an aluminum alloy.

12. An electrical contactor assembly of the type having line and load straps at opposite ends for connection with an electrical distribution circuit, the electrical contactor assembly comprising:
   a semiconductor switch assembly connecting said line and load straps, wherein said line and load straps provided on a bottom of said contactor;
   a heat sink support plate;
   a plurality of semiconductor switch devices mounted on said heat sink support plate;
   a cooling assembly arranged on said heat sink support plate for removing heat away from said heat sink support plate and said semiconductor switch devices; and
   a connector on said semiconductor switch devices for electrically connecting said semiconductor switch devices with said line and load straps, said connector including:
      a U-shaped block defining a first sidepiece and an opposing second side piece, said first and second sidepieces joined by a bridge, said bridge including a first pair of apertures arranged superjacent a corresponding second pair of apertures within said semiconductor switch devices.

13. The electrical contactor assembly of claim 12 including:
   a third aperture within said first sidepiece and a fourth aperture within said second sidepiece, said third and fourth apertures being arranged subjacent line and load straps.

14. The electrical contactor assembly of claim 13 including:
   a pair of apertured spacers arranged between said line and load straps and said first and second sidepieces for connecting said line and load straps with said first and second sidepieces.

15. The electrical contactor assembly of claim 14 wherein said cooling assembly is air cooled or liquid cooled.

16. The electrical contactor assembly of claim 15 wherein said air cooling device comprises a fan.

17. The electrical contactor assembly of claim 12 wherein said semiconductor switch devices comprise silicon controller rectifiers.

18. The electrical contactor assembly of claim 12 wherein said heat sink support plate comprises an aluminum alloy.

19. The electrical contactor assembly of claim 12 wherein said U-shaped block comprises an aluminum alloy.

20. The electrical contactor assembly of claim 14 wherein said spacers comprise an aluminum alloy.

* * * * *